United States Patent
Song

(10) Patent No.: US 9,036,440 B2
(45) Date of Patent: May 19, 2015

(54) SEMICONDUCTOR MEMORY DEVICE

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 148 days.

(21) Appl. No.: 13/716,418

(22) Filed: Dec. 17, 2012

(65) Prior Publication Data

US 2014/0003178 A1 Jan. 2, 2014

(30) Foreign Application Priority Data

Jun. 28, 2012 (KR) .................. 10-2012-0069691

(51) Int. Cl.
G11C 7/00 (2006.01)
G11C 11/402 (2006.01)
G11C 11/406 (2006.01)

(52) U.S. Cl.
CPC ........ *G11C 11/402* (2013.01); *G11C 11/40611* (2013.01); *G11C 11/40615* (2013.01); *G11C 2211/4061* (2013.01); *G11C 2211/4067* (2013.01)

(58) Field of Classification Search
CPC ........... G11C 11/402; G11C 11/40611; G11C 11/40615
USPC .............................................. 365/222, 233.1
See application file for complete search history.

(56) References Cited

U.S. PATENT DOCUMENTS

| | | | | |
|---|---|---|---|---|
| 5,796,669 A | * | 8/1998 | Araki et al. | 365/222 |
| 5,835,448 A | * | 11/1998 | Ohtani et al. | 365/233.1 |
| 5,901,101 A | * | 5/1999 | Suzuki et al. | 365/222 |
| 6,166,990 A | * | 12/2000 | Ooishi et al. | 365/233.11 |
| 6,215,714 B1 | * | 4/2001 | Takemae et al. | 365/222 |
| 6,414,894 B2 | * | 7/2002 | Ooishi et al. | 365/222 |
| 6,438,055 B1 | * | 8/2002 | Taguchi et al. | 365/222 |
| 6,597,617 B2 | * | 7/2003 | Ooishi et al. | 365/222 |
| 6,629,224 B1 | * | 9/2003 | Suzuki et al. | 711/167 |
| 6,728,157 B2 | * | 4/2004 | Yagishita et al. | 365/222 |
| 6,771,553 B2 | * | 8/2004 | Cowles et al. | 365/222 |
| 7,046,579 B2 | * | 5/2006 | Suyama | 365/189.14 |
| 7,079,439 B2 | * | 7/2006 | Cowles et al. | 365/222 |
| 7,710,809 B2 | * | 5/2010 | Ahn et al. | 365/222 |
| 7,719,916 B2 | * | 5/2010 | Chun | 365/222 |
| 7,729,191 B2 | * | 6/2010 | Smith et al. | 365/226 |
| 8,456,937 B2 | * | 6/2013 | Ku | 365/222 |
| 8,630,144 B2 | * | 1/2014 | Nakamura et al. | 365/233.1 |
| 8,743,644 B2 | * | 6/2014 | Oh et al. | 365/225.7 |

FOREIGN PATENT DOCUMENTS

| | | |
|---|---|---|
| KR | 1020060135227 | 12/2006 |
| KR | 1020110109804 | 10/2011 |

* cited by examiner

*Primary Examiner* — Viet Q Nguyen
(74) *Attorney, Agent, or Firm* — IP & T Group LLP

(57) ABSTRACT

A semiconductor memory device includes a memory cell array configured to include a plurality of word lines, a clock enable buffer configured to receive a clock enable signal, a plurality of command buffers configured to receive a plurality of commands, a refresh control unit configured to sequentially activate the plurality of word lines in a self-refresh mode, a command decoder configured to decode the clock enable signal and the plurality of commands, and to allow the refresh control unit to enter the self-refresh mode or exit from the self-refresh mode, and a buffer control unit configured to disable the plurality of command buffers when the clock enable signal is deactivated, and to enable the plurality of command buffers when the refresh control unit exits from the self-refresh mode.

16 Claims, 7 Drawing Sheets

SEMICONDUCTOR MEMORY DEVICE

CROSS-REFERENCE TO RELATED APPLICATIONS

The present application claims priority of Korean Patent Application No. 10-2012-0069691, filed on Jun. 28, 2012, which is incorporated herein by reference in its entirety.

BACKGROUND

1. Field

Exemplary embodiments of the present invention relate to a semiconductor design technology, and more particularly, to a technology of a buffer control for a refresh operation in a semiconductor memory device.

2. Description of the Related Art

Recently, research into a technology for reducing current consumption of a semiconductor memory device has been variously conducted. Particularly, as a rapid increase in demands for mobile devices such as mobile phones or personal digital assistants (PDAs), an effort for reducing current consumption of a semiconductor memory device (for example, a dynamic random access memory (DRAM)) mounted in such mobile devices has been continued. According to one of various methods for reducing the current consumption of the semiconductor memory device, reducing the current consumption for a refresh operation in the semiconductor memory device is an issue.

Among various kinds of semiconductor memory devices, the DRAM has characteristics that data stored in a memory cell is lost according to the passage of time, unlike a static random access memory (SRAM), a flash memory, or the like. In order to substantially prevent this, an operation, in which information stored in the cell is rewritten from an exterior in a given cycle, is performed, and such a series of operations are called the refresh operation. All word lines in the DRAM have to be activated at least once in a retention time, and data corresponding to the activated word line are sensed and amplified in the refresh operation. The retention time indicates a time for which data is written in a cell and then may be substantially maintained in the cell without the refresh operation.

The refresh operation is classified into an auto-refresh operation (or an auto-refresh mode), which is performed in a normal mode, and a self-refresh operation (or a self-refresh mode), which is performed in a power-down mode (a state in which a clock enable signal CKE has been deactivated).

FIG. 1 is a timing diagram for explaining a self-refresh operation.

A self-refresh mode is entered when, in a state in which a clock enable signal CKE has been deactivated, a combination of signals input by a plurality of command buffers (not illustrated in FIG. 1) corresponds to a refresh command AREF.

A self-refresh signal SREF defines a period that the elf-refresh mode is performed, and a refresh signal REF is a signal indicating that refresh is being internally performed (that is, a signal for controlling a word line to be activated for the refresh operation). A clock CK is a clock signal with which operations of the DRAM is synchronized. The self-refresh signal SREF is activated when a semiconductor memory device enters the self-refresh mode (SRE), and is deactivated when the semiconductor memory device exits from the self-refresh mode (SRX).

As illustrated in FIG. 1 there exist a case in which a word line is activated before the self-refresh mode is completed and the activation of the word line may be completed after the self-refresh mode is completed. That is, although the self-refresh mode has been completed, the refresh operation, which has been internally started before the self-refresh mode is completed, may be continued after the self-refresh mode is completed.

Since the semiconductor memory device does not receive a plurality of commands and a plurality of addresses from an exterior when performing the refresh operation, it is not necessary to use a plurality of command buffers for receiving the plurality of commands and a plurality of address buffers for receiving the plurality of addresses. Since these buffers continuously consume current in an enabled state, a technology of activating or deactivating the plurality of command buffers and the plurality of address buffers at a proper time according to auto-refresh and self-refresh is needed, in order to possibly reduce current consumption of the semiconductor memory device.

SUMMARY

Exemplary embodiments of the present invention are directed to a semiconductor memory device capable of reducing current consumption in a refresh operation.

In accordance with an embodiment of the present invention, a semiconductor memory device includes a memory cell array configured to include a plurality of word lines, a clock enable buffer configured to receive a clock enable signal, a plurality of command buffers configured to receive a plurality of commands, a refresh control unit configured to sequentially activate the plurality of word lines in a self-refresh mode, a command decoder configured to decode the clock enable signal and the plurality of commands, and to allow the refresh control unit to enter the self-refresh mode or exit from the self-refresh mode, and a buffer control unit configured to disable the plurality of command buffers when the clock enable signal is deactivated, and to enable the plurality of command buffers when the refresh control unit exits from the self-refresh mode.

In accordance with another embodiment of the present invention, a semiconductor memory device includes a memory cell array configured to include a plurality of word lines, a clock enable buffer configured to receive a clock enable signal, a plurality of command buffers configured to receive a plurality of commands, a refresh control unit configured to sequentially activate the plurality of word lines in a self-refresh mode, a command decoder configured to decode the clock enable signal and the plurality of commands, and to allow the refresh control unit to enter the self-refresh mode or exit from the self-refresh mode, and a buffer control unit configured to enable the plurality of command buffers when the clock enable signal is activated in a case in which the refresh control unit performs the word line activation operation in the self-refresh mode.

In accordance with another embodiment of the present invention, a semiconductor memory device includes a memory cell array configured to include a plurality of word lines, a clock enable buffer configured to receive a clock enable signal, a plurality of command buffers configured to receive a plurality of commands, a plurality of address buffers configured to receive an address, a refresh control unit configured to sequentially activate the plurality of word lines in a self-refresh mode, a command decoder configured to decode the clock enable signal and the plurality of commands, and to allow the refresh control unit to enter the self-refresh mode or exit from the self-refresh mode, and a buffer control unit configured to disable the plurality of command buffers and the plurality of address buffers when the clock enable signal is deactivated, and to enable the plurality of command buffers and the plurality of address buffers when the refresh control unit exits from the self-refresh mode.

In accordance with another embodiment of the present invention, a semiconductor memory device includes a memory cell array configured to include a plurality of word lines, a clock enable buffer configured to receive a clock enable signal, a plurality of command buffers configured to receive a plurality of commands, a plurality of address buffers configured to receive an address, a refresh control unit configured to sequentially activate the plurality of word lines in a self-refresh mode, a command decoder configured to decode the clock enable signal and the plurality of commands, and to allow the refresh control unit to enter the self-refresh mode or exit from the self-refresh mode, and a buffer control unit configured to enable the plurality of command buffers and the plurality of address buffers when the clock enable signal is activated in a case in which a refresh control unit performs the word line activation operation in the self-refresh mode.

In accordance with another embodiment of the present invention, a semiconductor memory device includes a memory cell array configured to include a plurality of word lines, a clock enable buffer configured to receive a clock enable signal, a plurality of command buffers configured to receive a plurality of commands, a refresh control unit configured to sequentially activate the plurality of word lines in a self-refresh mode, a command decoder configured to decode the clock enable signal and the plurality of commands, and to allow the refresh control unit to enter the self-refresh mode or exit from the self-refresh mode, and a buffer control unit configured to enable the plurality of command buffers when a control signal input to the clock enable buffer is activated in a case in which the refresh control unit performs the word line activation operation in the self-refresh mode.

According to the embodiments of the present invention, it may be possible to reduce current consumption of a semiconductor memory device in a refresh operation by deactivating a plurality of command buffers unused and a plurality of address buffers unused at a proper time while substantially alleviating concerns regarding the unnecessary current consumption from being occurring before and after refresh operations including an auto-refresh operation and a self-refresh operation.

DETAILED DESCRIPTION

Figure 1:
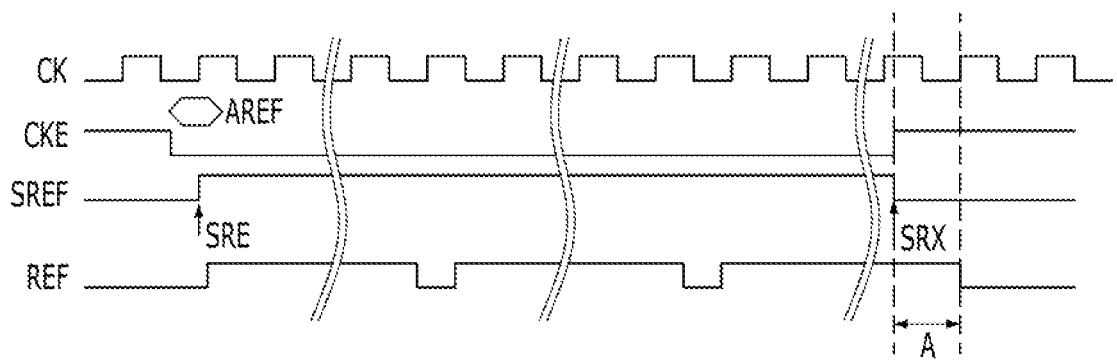
FIG. 1 is a diagram for explaining a self-refresh operation.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. In addition, a singular form may include a plural form as long as it is not specifically mentioned in a sentence.

Since a refresh operation is an operation for activating word lines corresponding to a plurality of memory cells and rewriting data thereto, a description for a configuration related only to a column operation and the column operation of the semiconductor memory device will be omitted.

Figure 2:
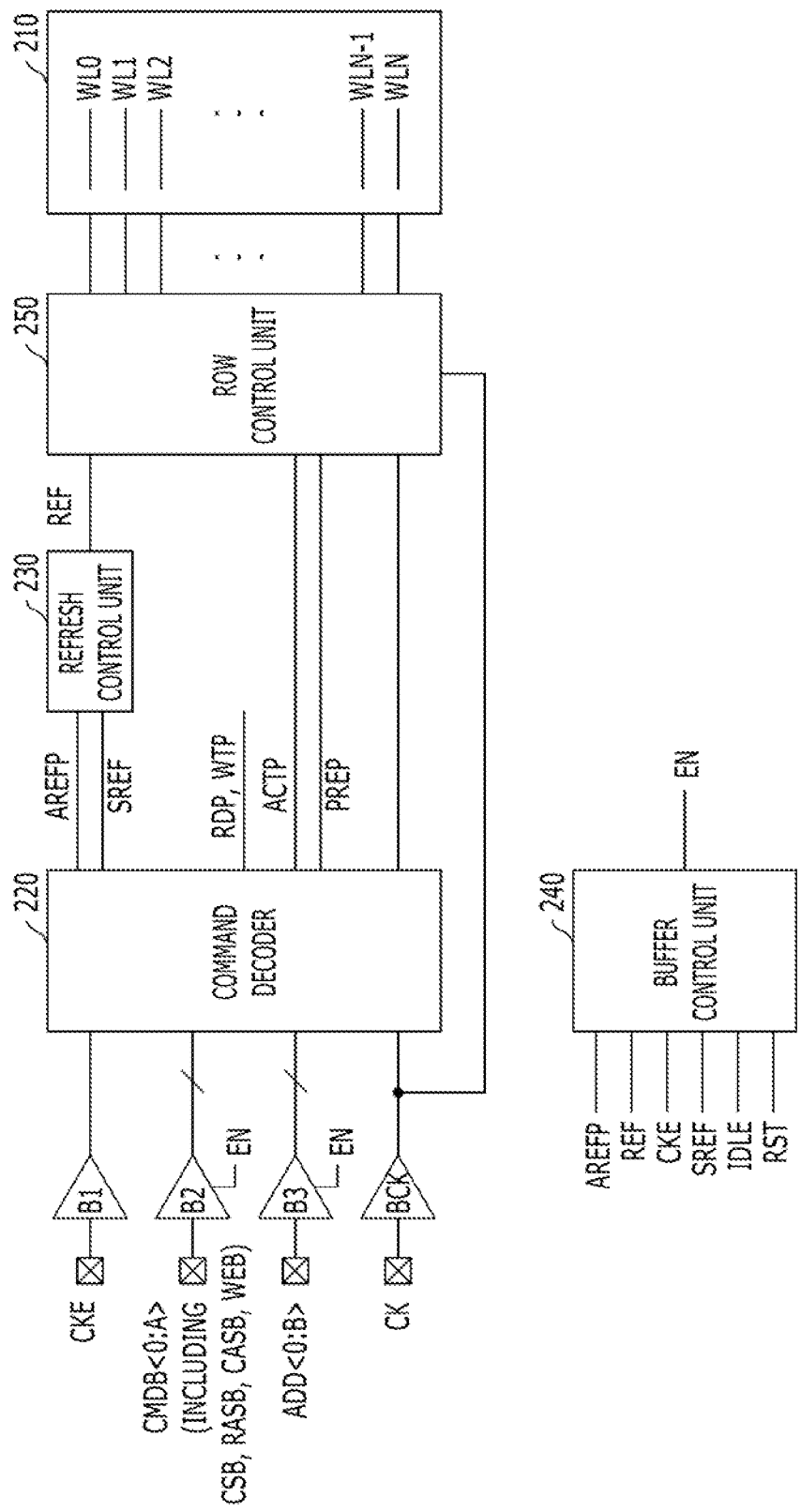
FIG. 2 is a configuration diagram illustrating a semiconductor memory device in accordance with an embodiment of the present invention.

FIG. 2 is a configuration diagram illustrating a semiconductor memory device in accordance with an embodiment of the present invention.

As illustrated in FIG. 2, the semiconductor memory device includes a memory cell array 210 including a plurality of word lines WL0 to WLN, a clock enable buffer B1 configured to receive a clock enable signal CKE, a plurality of command buffers B2 configured to receive a plurality of commands CMDB<0:A>, a plurality of address buffers B3 configured to receive a plurality of addresses ADD<0:B a refresh control unit 230, a command decoder 220, and a buffer control unit 240. The refresh control unit 230 is configured to sequentially activate the plurality of word lines WL0 to WLN in a self-refresh mode. The command decoder 220 is configured to decode the clock enable signal CKE received in the clock enable buffer 51 and the plurality of commands CMDB<0:A> received in the plurality of command buffers B2, and to allow the refresh control unit 230 to enter the self-refresh mode or to exit from the self-refresh mode. The buffer control unit 240 is configured to disable the plurality of command buffers B2 and the plurality of address buffers B3 when the clock enable signal CKE received in the clock enable buffer B1 is deactivated, and to enable the plurality of command buffers B2 and the plurality of address buffers B3 when the refresh control unit 230 exits from the self-refresh mode. Furthermore, the semiconductor memory device includes a row control unit 250 configured to control a row operation of the memory cell array 210 and a clock buffer BCK configured to receive a clock CK.

FIG. 2 illustrates only one command buffer B2 and one address buffer B3 for the purpose of simplification. However, there actually exist the plurality of command buffers B2 configured to receive the respective commands CMDB<0> to CMDB<A> (that is, (A+1) command buffers B2 exist) and the plurality of address buffers B3 configured to receive the respective addresses ADD<0> and ADD<B> (that is, (B+1) address buffers B3 exist).

With reference to FIG. 2, the semiconductor memory device will be described below.

The clock enable buffer B1 is configured to receive, buffer, and output the clock enable signal CKE. The clock enable signal CKE is used to determine whether to enter the self-refresh mode or exit from the self-refresh mode, and to determine whether to enter a power-down mode or exit from the power-down mode.

The plurality of command buffers B2 are configured to receive, buffer, and output command signals corresponding to the plurality of command buffers B2 among the plurality of commands CMDB<0:A>. The plurality of commands CMDB<0:A> are used to determine an operation to be performed by the semiconductor memory device, and include at least a chip select signal CSB, a row address strobe signal RASB, a column address strobe signal CASB, and a write enable signal WEB. Furthermore, 'B' attached to the end of the abbreviations of the signals indicates signals, which are activated at a low level.

The plurality of address buffers B3 are configured to receive, buffer, and output addresses corresponding to the plurality of address buffers B3 among the plurality of addresses ADD<0:B>. Among the plurality of addresses, some are used for various settings of the semiconductor memory device (for example, a mode register set (MRS) sets a latency value of the semiconductor memory device, and the like) and some are used for designating addresses of memory cells in which data is to be stored in a write operation, or addresses of memory cells from which data is read in a read operation.

A clock buffer BCK is configured to receive, buffer, and output the clock CK. The semiconductor memory device performs alt operations in synchronization with the input clock CK.

The command decoder 220 is configured to generate internal commands or internal signals for given operations of the semiconductor memory device in response to the clock enable signal CKE received in the clock enable buffer 61, the plurality of commands CMDB<0:A> received in the plurality of command buffers B2, and the plurality of addresses ADD<0:B> received in the plurality of address buffers B3. Internal commands or internal signals to be generated are determined by a combination of the clock enable signal CKE, the plurality of commands CMDB<0:A>, and the plurality of addresses ADD<0:B>. The plurality of commands CMDB<0:A> includes the chip select signal CSB, the row address strobe signal RASB, the column address strobe signal CASB, and write enable signal WEB.

The internal commands generated by the command decoder 220 include an internal active command ACTP for activating the memory cell array 210 so that the memory cell array 210 may be accessed, an internal precharge command PREP for closing the memory cell array 210 when an active operation is completed, an internal read command RDP for reading data of a memory cell included in the memory cell array 210, an internal write command WTP for writing data in a memory cell included in the memory cell array 210, an internal refresh command AREFP for refreshing a memory cell included in the memory cell array 210, a self-refresh signal SREF for allowing the semiconductor memory device to enter the self-refresh mode or exit from the self-refresh mode, and the like. Hereinafter, the generation and role of the internal refresh command AREFP and the self-refresh signal SREF will be mainly described. Furthermore, the command decoder 220 may perform the aforementioned operation in synchronization with the clock CK received from the clock buffer BCK.

Hereinafter, the refresh operation will be mainly described. The command decoder 220 allows the refresh control unit 230 to enter the self-refresh mode or to exit from the self-refresh mode in response to the clock enable signal CKE received in the clock enable buffer and the plurality of commands CMDB<0:A> received in the plurality of command buffers B2.

In more detail, in the state in which the clock enable signal CKE is deactivated, when a combination of the plurality of commands CMDB<0:A> corresponds to the refresh command AREF, the command decoder 220 allows the refresh control unit 230 to enter the self-refresh mode. After the refresh control unit 230 enters the self-refresh mode, when the clock enable signal CKE substantially maintains the deactivated state, the command decoder 220 allows the refresh control unit 230 to substantially maintain the self-refresh mode. In the state in which the refresh control unit 230 is in the self-refresh mode, when the clock enable signal CKE is activated, the command decoder 220 allows the refresh control unit 230 to exit from the self-refresh mode.

Meanwhile, in the state in which the clock enable signal CKE is deactivated, when the combination of the plurality of commands CMDB<0:A> corresponds to the refresh command AREF, the command decoder 220 allows the refresh control unit 230 to perform a refresh operation in an auto-refresh mode.

For such an operation, the command decoder 220 generates the internal refresh command AREFP and the self-refresh signal SREF, and activates the internal refresh command AREFP and the self-refresh signal SREF when the combination of the plurality of commands CMDB<0:A> corresponds to the refresh command AREF in the state in which the clock enable signal CKE is deactivated. Furthermore, in the state in which the self-refresh signal SREF is activated, when the clock enable signal CKE substantially maintains the deactivated state, the command decoder 220 allows the self-refresh signal SREF to substantially maintain the activated state. In the state in which the self-refresh signal SREF is activated, when the clock enable signal CKE is activated, the command decoder 220 deactivates the self-refresh signal SREF. The internal refresh command AREFP allows the refresh control unit 230 to perform the refresh operation. When the self-refresh signal SREF is activated, the refresh control unit 230 enters the self-refresh mode, and when the self-refresh signal SREF is deactivated, the refresh control unit 230 exits from the self-refresh mode.

The refresh control unit 230 controls memory cells included in the memory cell array 210 to be refreshed in response to the internal refresh command AREFP and the self-refresh signal SREF generated by the command decoder 220. The refresh control unit 230 generates a refresh signal REF for allowing a word line selected from the plurality of word lines WL0 to WLN included in the memory cell array 210 to be activated for a given period. The refresh signal REF is input to the row control unit 250, and the row control unit 250 activates the selected word line in the period in which the refresh signal REF is activated. The refresh signal REF may indicate that the refresh operation is internally continued.

When performing a refresh operation in the self-refresh mode, the refresh control unit 230 continuously activates the refresh signal REF until the refresh control unit 230 exits from the self-refresh mode. That is, in the state in which the self-refresh signal SREF is activated, when the refresh command AREF is applied, the refresh control unit 230 continuously activates the refresh signal REF at a given interval until the self-refresh signal SREF is deactivated, and the plurality of word lines WL included in the memory cell array 210 are sequentially activated in response to the refresh signal REF. In the refresh operation since the semiconductor memory device does not receive addresses, a word line to be selected when the refresh signal, REF is activated is changed using an address counter (not illustrated in FIG. 2) included in the semiconductor memory device. At this time, the address counter may be designed to increase addresses when the refresh signal REF is activated.

When performing the refresh operation in the auto-refresh mode, such as auto-refresh mode, the refresh control unit 230 activates the refresh signal REF by a given number of times in response to the internal refresh command AREFP. At this time, the number of times, by which the refresh signal REF is activated in response to a one-time internal refresh command AREFP, may be changed according to design. The number of word lines to be activated may be determined based on the number of times by which the refresh signal REF is activated. Hereinafter, a description will be provided for a case in which the refresh signal REF is activated once in response to a one-time internal refresh command AREFP.

When the refresh operation is performed, the buffer control unit 240 controls the plurality of command buffers B2 and the plurality of address buffers B3 in response to the clock enable signal CKE, the internal refresh command AREFP, the refresh signal REF, and the self-refresh signal SREF.

While the refresh operation is being performed, since the semiconductor memory device does not receive the plurality of commands CMDB<0:A> and the plurality of addresses ADD<0:B>, the buffer control unit 240 disables the plurality of command buffers B2 and the plurality of address buffers B3, thereby reducing current consumption. Then, after the refresh operation is completed by the refresh control unit 230 (activation of a word line for refresh is completed) or the refresh control unit 230 exits from the self-refresh mode, it may be necessary to receive the plurality of commands CMDB<0:A> and the plurality of addresses ADD<0:B> for the operation of the semiconductor memory device.

The semiconductor memory device operates by receiving various commands generated according to combinations of the command signals CSB, RASB, CASB, and WEB. The various commands include commands, which are applied after the semiconductor memory device exits from the self-refresh mode and a time sufficiently passes because the support of various circuits (for example, a DLL and the like) of the semiconductor memory device is required or a time required for executing commands is short, and commands, which are applied immediately after the semiconductor memory device exits from the self-refresh mode because the support of various circuits of the semiconductor memory device is not required or a time required for executing commands is long.

For example, a command, which is applied immediately after the semiconductor memory device exits from the self-refresh mode, may include ZQCL command (command for ZQ calibration executed for a long time), ZQCS command (command for ZQ calibration executed for a short time), some of MRS commands (commands for setting mode registers, such as CAS latency setting command or CAS write latency setting command), or the like. Whether the plurality of commands are applied or not immediately after the semiconductor memory device exits from the self-refresh mode may be changed according to design.

In the conventional semiconductor memory device, it may be not be feasible to enable buffers immediately after the semiconductor memory device exits from the self-refresh mode. Therefore, in the case in which the conventional semiconductor memory device has exited from the self-refresh mode, when refresh is being performed in the semiconductor memory device, since the buffers are not enabled, a concern may arise in receiving some commands. In order to alleviate this concern, when the buffers are not disabled in the self-refresh mode, and thus current consumption is increased.

In this regard, in order for the semiconductor memory device to normally receive all commands while reducing current consumption of the buffers in the self-refresh mode, it may be necessary to consider the commands, which are applied immediately after the semiconductor memory device exits from the self-refresh mode as described above. That is, when the semiconductor memory device enters the self-refresh mode, it may be necessary to disable the buffers, and when the semiconductor memory device exits from the self-refresh mode, it may be necessary to quickly enable the plurality of command buffers B2 and the plurality of address buffers B3 regardless of the internal refresh operation of the semiconductor memory device.

For such an operation, when the refresh operation is performed in the self-refresh mode, the buffer control unit 240 enables or disables the plurality of command buffers B2 and the plurality of address buffers B3 in response to the clock enable signal CKE. The plurality of command buffers B2 and the plurality of address buffers B3 are enabled when a buffer enable signal EN is activated, and are disabled when the buffer enable signal EN is deactivated. Thus, when the refresh operation is performed in the self-refresh mode, the buffer control unit 240 deactivates the buffer enable signal EN when the clock enable signal CKE is deactivated and activates the buffer enable signal EN when the clock enable signal CKE is activated.

When the clock enable signal CKE is activated in the self-refresh mode, the semiconductor memory device exits from the self-refresh mode. That is, in the case in which the refresh operation is performed in the self-refresh mode, when the semiconductor memory device exits from the self-refresh mode, the buffer control unit 240 activates the buffer enable signal EN although the refresh operation is being performed (the word lines WL are activated).

When the refresh operation is performed in the auto-refresh mode, the buffer control unit 240 disables the plurality of command buffers B2 and the plurality of address buffers B3 in response to the internal refresh command AREFP. When the refresh operation is completed (that is, the refresh signal REF is deactivated), the buffer control unit 240 enables the plurality of command buffers B2 and the plurality of address buffers B3. That is, the buffer control unit 240 disables the plurality of command buffers B2 and the plurality of address buffers B3 in a period in which the refresh operation is performed (the word lines WL are activated).

In order to perform the aforementioned operation, when the self-refresh signal SREF is activated, the buffer control unit 240 activates or deactivates the buffer enable signal EN in response to the clock enable signal CKE. Furthermore, when the self-refresh signal SREF is not activated, the buffer control unit 240 activates or deactivates the buffer enable signal EN in response to the internal refresh command AREFP and the refresh signal REF.

The row control unit 250 controls a row operation of the memory cell array 210 in response to an output signal of the command decoder 220, and activates selected word lines WL for a given period. In the refresh operation, the row control unit 250 activates selected word lines WL selected by the address counter for a period in which the refresh signal REF is activated. In the case of operations other than the refresh operation, the row control unit 250 activates selected word lines WL selected by the plurality of addresses ADD<0:B>, and controls data of the memory cell array 210 to be accessed (an active operation, a read operation, and a write operation), or deactivates selected and activated word lines (a precharge operation).

In the semiconductor memory device according to the present invention, when the refresh operation is performed in the self-refresh mode, the buffers are enabled or disabled by the clock enable signal CKE, and when the refresh operation is performed in the auto-refresh mode, the buffers are enabled or disabled by the internal refresh command AREFP and the refresh signal REF. That is, since signals for controlling the buffers are different from each other in the self-refresh mode and the auto-refresh mode, it may be possible to disable the buffers in the self-refresh mode and to reduce current consumption. Furthermore, when the semiconductor memory device exits from the self-refresh mode, the buffers are immediately enabled regardless of the internal refresh operation, so that the semiconductor memory device may receive commands and addresses. Since the configuration of the buffers, a method for activating or deactivating the buffers using the buffer enable signal for controlling the buffers, and a principle capable of reducing current consumption of the buffers are well-known in those skilled in the art, a description thereof will be omitted.

Figure 3:
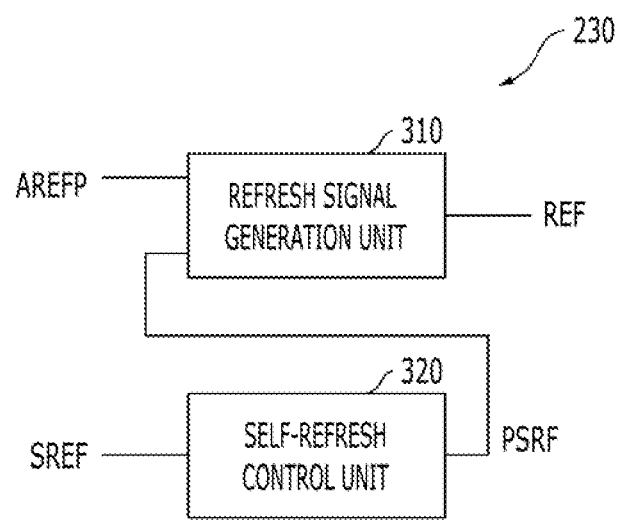
FIG. 3 is a detailed diagram of a refresh control unit shown in FIG. 2.
Figure 4:
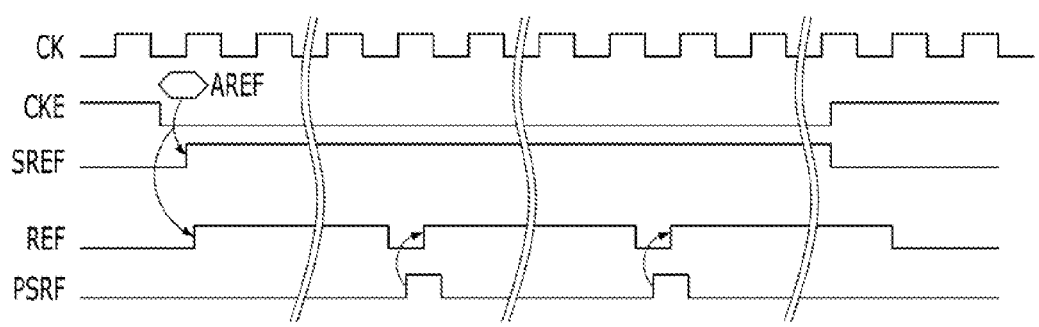
FIG. 4 is a waveform diagram for explaining an operation in a self-refresh mode.
Figure 5:
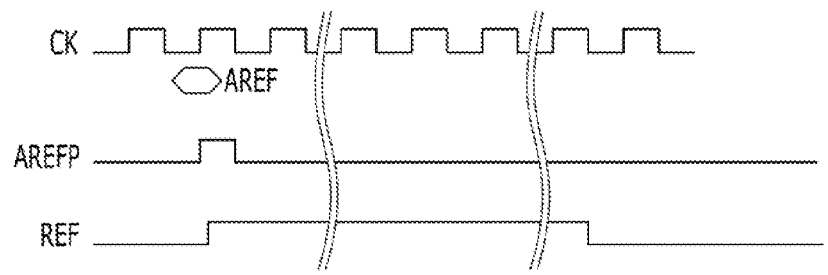
FIG. 5 is a waveform diagram for explaining an operation in an auto-refresh mode.

FIG. 3 is a detailed diagram of the refresh control unit 230 shown in FIG. 2, FIG. 4 is a waveform diagram for explaining an operation in the self-refresh mode, and FIG. 5 is a waveform diagram for explaining a refresh operation in the auto-refresh mode.

As illustrated in FIG. 3, the refresh control unit 230 includes a refresh signal generation unit 310 and a self-refresh control unit 320. The refresh signal generation unit 310 is configured to activate the refresh signal REF for a given period in response to the internal refresh command AREFP or a succeeding self-refresh pulse PSRF. The self-refresh control unit 320 is configured to continuously activate the succeeding self-refresh pulse PSRF in response to the self-refresh signal SREF.

With reference to FIGS. 3 to 5, the refresh operation of the semiconductor memory device will be described while focusing on the operation of the refresh control unit 230.

In the state in which the clock enable signal CKE is deactivated, when a combination of the plurality of commands CMDB<0:A> corresponds to the refresh command AREF (that is, when the refresh command AREF is input from an exterior), the self-refresh signal SREF is activated and the refresh control unit 230 enters the self-refresh mode.

When performing the refresh operation in the self-refresh mode, the refresh signal generation unit 310 primarily activates the refresh signal REF in response to the internal refresh command AREFP. Then, the self-refresh control unit 320 activates the succeeding self-refresh pulse PSRF at a given interval in response to an activated self-refresh signal SREF, and the refresh signal generation unit 310 activates the refresh signal REF for a given period when the succeeding self-refresh pulse PSRF is activated.

Then, while the clock enable signal CKE is substantially maintaining the deactivated state, the self-refresh signal SREF substantially maintains the activated state. When the clock enable signal CKE is activated, the self-refresh signal SREF is deactivated and the refresh control unit 230 exited from the self-refresh mode. At this time, a refresh operation started in the activated state of the self-refresh signal SREF may be continued even after the self-refresh signal SREF is deactivated. That is, even after the self-refresh signal SREF is deactivated, the refresh signal REF may be in the activated state for a given time.

In the state in which the clock enable signal CKE is activated, when the refresh command AREF is input from an exterior, the internal refresh command AREFP is activated without the activation of the self-refresh signal SREF, and the refresh signal generation unit 310 activates the refresh signal REF by a given number of times in response to the internal refresh command AREFP (FIG. 5 illustrates the case in which the refresh signal REF is activated once).

Figure 6:
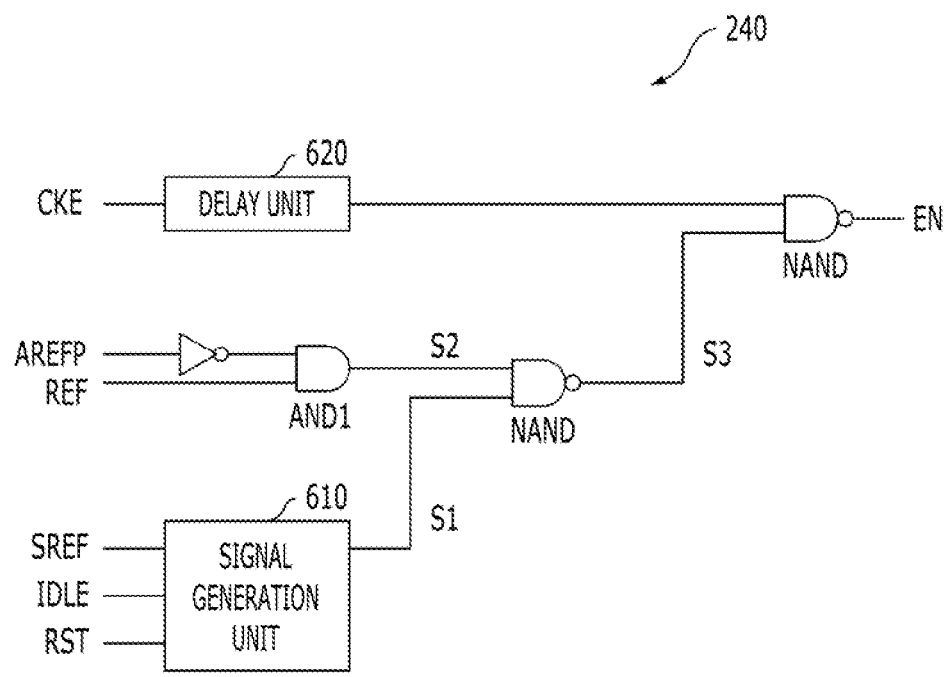
FIG. 6 is a configuration diagram illustrating a buffer control unit shown in FIG. 2.
Figure 7:
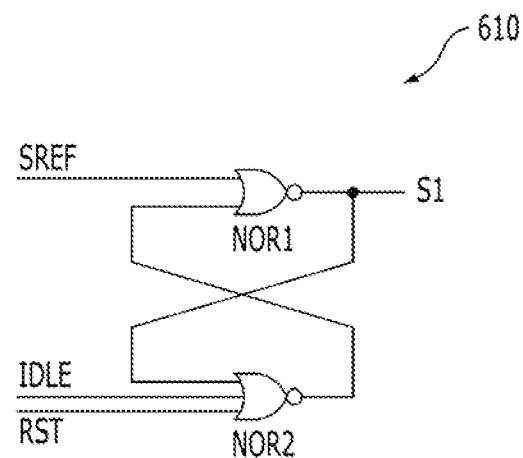
FIG. 7 a detailed diagram illustrating a signal generation unit shown in FIG. 6.
Figure 8:
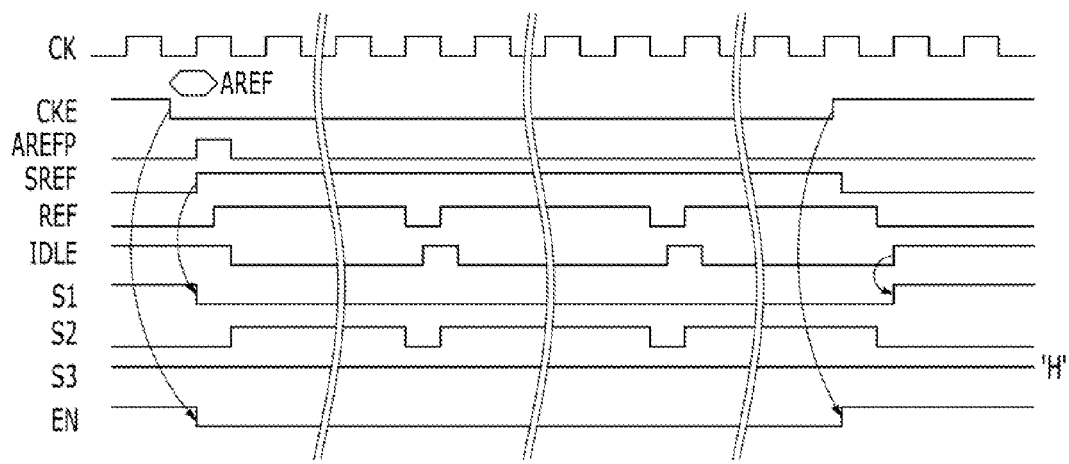
FIGS. 8 and 9 are waveform diagrams for explaining an operation of a buffer control unit shown in FIGS. 2, 6, and 7, in a self-refresh mode.
Figure 9:
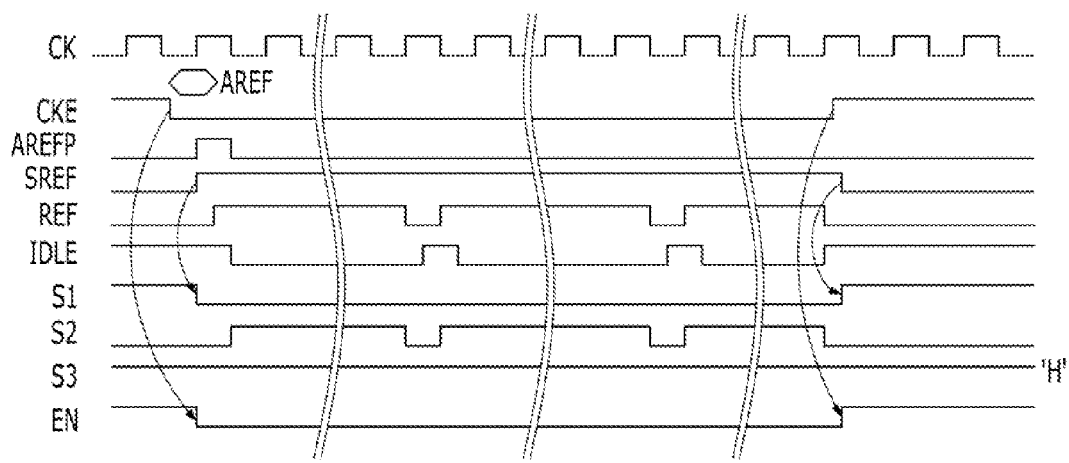
Figure 10:
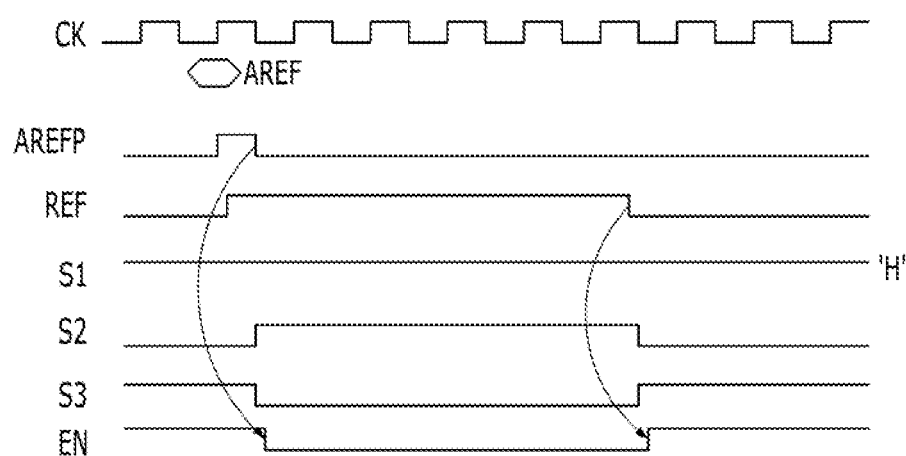
FIG. 10 is a waveform diagram for explaining an operation of a buffer control unit shown in FIGS. 2, 6, and 7, in an auto-refresh mode.

FIG. 6 is a configuration diagram of the buffer control unit 240 shown in FIG. 2, FIG. 7 is a detailed diagram of a signal generation unit shown in FIG. 6, FIGS. 8 and 9 are waveform diagrams for explaining the operation of the buffer control unit 240 shown in. FIGS. 2, 6, and 7, in the self-refresh mode, and FIG. 10 is a waveform diagram for explaining the operation of the buffer control unit 240 shown in FIGS. 2, 6, and 7 in the auto-refresh mode.

As illustrated in FIG. 6, the buffer control unit 240 includes the signal generation unit 610 configured to generate a first signal S1 in response to the self-refresh signal SREF, an idle signal IDLE, and a reset signal RST, an AND gate AND1 configured to generate a second signal S2 in response to the internal refresh command AREFP and the refresh signal REF, a NAND gate NAND configured to combine the first signal S1 with the second signal S2 and generate a third signal S3, a delay unit 620 configured to delay the clock enable signal CKE, and an AND gate AND2 configured to combine the clock enable signal CKE with the third signal S3 and generate the buffer enable signal EN.

The idle signal IDLE indicates whether the memory cell array 210 is in an idle state and the reset signal RST is used to initialize the semiconductor memory device. The idle state indicates a state in which the memory cell array 210 is closed (all word lines are precharged) and other operations are ready to be performed according to commands. The idle signal IDLE has a waveform obtained by inverting the refresh signal REF and delaying the phase of the inverted signal.

With reference to FIGS. 6 to 10, the buffer control unit 240 will be described.

The signal generation unit 610 allows the first signal S1 to have a 'low' level when the self-refresh signal SREF is activated, and allows the first signal S1 to have a 'high' level when the idle signal IDLE or the reset signal RST is activated in the state in which the self-refresh signal SREF is deactivated. Since the reset signal RST is activated only when the semiconductor memory device is initialized, the reset signal RST substantially maintains a deactivated state at all times while the refresh operation is being performed.

For such an operation, the signal generation unit 610 may be formed of a SR latch, which employs the self-refresh signal SREF as a set input and employs the idle signal IDLE and the reset signal RST as reset inputs. Furthermore, the signal generation unit 610 may include a first NOR gate NOR1 and a second NOR gate NOR2. The first NOR gate NOR1 inputs the self-refresh signal SREF and the output of the second NOR gate NOR2 as input and to output the first signal S1. The second NOR gate NOR2 inputs the idle signal IDLE, the reset signal RST, and the first signal S1.

The delay unit 620 delays the clock enable signal CKE by a given time and outputs the delayed signal. This is for allowing the plurality of command buffers to receive the refresh command AREF from an exterior even when the clock enable signal CKE is deactivated and the buffer enable signal EN is deactivated.

In the state in which the clock enable signal CKE is deactivated, when the refresh command AREF is input from an exterior, the self-refresh signal SREF is activated, so that the semiconductor memory device enters the self-refresh mode. In the case in which the self-refresh operation is performed in the self-refresh mode, when the clock enable signal CKE is deactivated, the buffer enable signal EN is deactivated regardless of the value of the third signal S3. In the state in which the clock enable signal CKE is deactivated, when the refresh command AREF is applied from an exterior, the self-refresh signal SREF is activated and the first signal S1 has a 'low' level in response to the activated self-refresh signal SREF. While the first signal S1 is substantially maintaining the 'low' level, the third signal S3 which is the output of the NAND gate NAND, has a 'high' level regardless of the activation or deactivation of the internal refresh command AREFP and the refresh signal REF. Since the second signal S2 is obtained by performing an AND operation of an inversion signal of the internal refresh command AREFP and the refresh signal REF, the second signal S2 has a waveform as illustrated in the waveform diagrams of FIGS. 8 and 9.

Accordingly, when one input has a high level in the two-input AND gate, the output of the AND gate is determined according to the value of the other input. Accordingly, when the third signal S3 has a 'high' level, the activation of the buffer enable signal EN, which is the output of the AND gate AND2, is determined by the clock enable signal CKE. When the clock enable signal CKE is deactivated, the buffer enable signal EN is deactivated, and when the clock enable signal CKE is activated, the buffer enable signal EN is activated.

FIG. 8 illustrates the case in which a refresh operation finally performed is completed after the semiconductor memory device exits from the self-refresh mode, that is, a refresh signal REF finally activated is deactivated after the self-refresh signal SREF is deactivated. FIG. 9 illustrates the case in which the refresh operation finally performed is completed before the semiconductor memory device exits from the self-refresh mode, that is, a refresh signal REF finally activated is deactivated before the self-refresh signal SREF is deactivated.

In the former case, the first signal S1 is changed to a 'high' level when the idle signal IDLE is activated, and in the latter case, the first signal S1 is changed to a 'high' level when the self-refresh signal SREF is deactivated. However, in FIG. 8 and FIG. 9, the buffer control unit 240 activates or deactivates the buffer enable signal EN in response to the clock enable signal CKE.

When the clock enable signal CKE is not deactivated and the refresh command AREF is input form an exterior, the internal refresh command AREFP and the refresh signal REF are activated.

Since a current mode is not the self-refresh mode, there is no period in which the clock enable signal CKE and the self-refresh signal SREF are deactivated. Accordingly, the activation of the buffer enable signal EN, which is the output of the AND gate AND2, is determined by the third signal S3. Furthermore, since the self-refresh signal SREF is not activated, the first signal S1 substantially maintains a 'high' level. Accordingly the third signal S3, which is the output of the NAND gate NAND, is a signal obtained by inverting the second signal S2. As illustrated in FIG. 10, the second signal S2 has a 'high' level when the internal refresh command AREFP is deactivated in the state in which the refresh signal REF is activated, and has a 'low' level when the refresh signal REF is deactivated.

As a consequence, the buffer control unit 240 activates or deactivates the buffer enable signal EN in response to the internal refresh command AREFP and the refresh signal REF.

Using the aforementioned configuration the buffer control unit 240 activates or deactivates the buffer enable signal EN in response to the clock enable signal CKE when the refresh signal REF is activated, and activates or deactivates the buffer enable signal EN in response to the internal refresh command AREFP and the refresh signal REF when the refresh signal REF is not activated. Since the configuration diagram of the buffer control unit 240 is for illustrative purposes only, the buffer control unit 240 may have various configurations as long as it is possible to perform a function of changing the signal used to control the buffer enable signal EN based on the activation or deactivation of the self-refresh signal SREF.

The arrows in FIGS. 8 to 10 indicate the control states of the signals according to a change. For example, the first arrow of FIG. 8 indicates that the buffer enable signal EN is deactivated in response to a falling edge of the clock enable signal CKE, and the second arrow indicates that the first signal S1 is changed from a 'high' level to a 'low' level in response to a rising edge of the self-refresh signal SREF.

In the semiconductor memory device according to the present invention, the signal for controlling the buffers is changed according to whether the refresh operation is performed in the self-refresh mode, so that it may be possible to directly receive commands and addresses when the refresh operation is completed or the semiconductor memory device exits from the self-refresh mode, and to reduce current consumption by deactivating the buffers for receiving the plurality of commands and the plurality of addresses in a proper period. In FIGS. 2 to 10, the case, in which all the command buffers and all the address buffers are controlled according to the refresh operation, is described. However, it may be possible to control only the command buffers or only the address buffers according to necessity.

The aforementioned signals, except for CSB, RASP, CASB, and WEB, are activated to a 'high' level and deactivated to a 'low' level. However, the activation level of the signals may be changed according to design.

In the aforementioned example, when the semiconductor memory device operates in the self-refresh mode, the buffers are controlled by the clock enable signal CKE. However, it may be possible to control the buffers using another control signal, which has a logic value to be changed when the semiconductor memory device exits from the self-refresh mode period or generates a pulse, instead of the clock enable signal CKE. Even in such case, it may be possible to immediately enable the buffers when the semiconductor memory device exits from the self-refresh mode.

While the present invention is described with respect to the specific embodiments, it will be apparent to those skilled in the art that various changes and modifications may be made without departing from the spirit and scope of the invention as defined in the following claims.

What is claimed is:

1. A semiconductor memory device comprising:
   a memory cell array configured to include a plurality of word lines;
   a clock enable buffer configured to receive a clock enable signal;
   a plurality of command buffers configured to receive a plurality of commands;
   a refresh control unit configured to sequentially activate the plurality of word lines in a self-refresh mode;
   a command decoder configured to decode the clock enable signal and the plurality of commands, and to allow the refresh control unit to enter the self-refresh mode or exit from the self-refresh mode; and
   a buffer control unit configured to disable the plurality of command buffers when the clock enable signal is deactivated, and to enable the plurality of command buffers when the refresh control unit exits from the self-refresh mode,
   wherein, in a case in which the refresh control unit performs the word line activation operation in the self-refresh mode, when the refresh control unit exits from the self-refresh mode, the buffer control unit enables the plurality of command buffers regardless of the period in which the word lines are activated.

2. The semiconductor memory device of claim 1, wherein, when the refresh control unit performs the word line activation operation in an auto-refresh mode, the buffer control unit disables the plurality of command buffers in a period in which the word lines are activated.

3. The semiconductor memory device of claim 1, wherein the command decoder is configured to allow the refresh control unit to enter the self-refresh mode when a combination of the plurality of commands corresponds to a refresh command in a state in which the clock enable signal is deactivated, to allow the refresh control unit to substantially maintain the self-refresh mode when the clock enable signal substantially maintains a deactivated state in a state in which the refresh control unit is in the self-refresh mode, and to allow the refresh control unit to exit from the self-refresh mode when the clock enable signal is activated in the state in which the refresh control unit is in the self-refresh mode.

4. The semiconductor memory device of claim 1, wherein the refresh control unit is configured to enter the self-refresh mode when a self-refresh signal is activated, and to exit from the self-refresh mode when the self-refresh signal is deactivated.

5. The semiconductor memory device of claim 4, wherein the command decoder is configured to generate the self-refresh signal, to activate the self-refresh signal when a combination of the plurality of commands corresponds to a refresh command in a state in which the clock enable signal is deactivated, to allow the self-refresh signal to substantially maintain an activated state when the clock enable signal substantially maintains a deactivated state in a state in which the refresh control unit is in the self-refresh mode, and to deactivate the self-refresh signal when the clock enable signal is activated in the state in which the refresh control unit is in the self-refresh mode.

6. The semiconductor memory device of claim 5, wherein the word lines are activated in response to a refresh signal.

7. The semiconductor memory device of claim 6, wherein the refresh control unit is configured to continuously activate the refresh signal in a state in which the self-refresh signal is activated, and to activate the refresh signal by a given number of times when the combination of the plurality of commands corresponds to the refresh command.

8. The semiconductor memory device of claim 7, wherein the plurality of command buffers are configured to be enabled in response to a buffer enable signal.

9. The semiconductor memory device of claim 7, wherein the buffer control unit is configured to activate the buffer enable signal when the clock enable signal is activated in a case in which the self-refresh signal is activated, and to activate the buffer enable signal when the refresh signal is deactivated in a case in which the self-refresh signal is deactivated.

10. The semiconductor memory device of claim 1, wherein the plurality of command buffers are configured to receive a row address strobe signal, a column address strobe signal, a chip select signal, a write enable signal, and an active signal.

11. The semiconductor memory device of claim 9, further comprises a plurality of address buffers configured to receive an address.

12. The semiconductor memory device of claim 11, wherein the command decoder is configured to generate one or more of an internal active command, an internal precharge command, an internal read command, an internal write command, the refresh command, and the self-refresh signal in response to the clock enable signal, the plurality of commands, and the plurality of addresses.

13. The semiconductor memory device of claim 1, wherein the buffer control unit is configured to disable the plurality of command buffers after a given time passes when the clock enable signal is deactivated.

14. A semiconductor memory device comprising:
a memory cell array configured to include a plurality of word lines;
a clock enable buffer configured to receive a clock enable signal;
a plurality of command buffers configured to receive a plurality of commands;
a plurality of address buffers configured to receive an address;
a refresh control unit configured to sequentially activate the plurality of word lines in a self-refresh mode;
a command decoder configured to decode the clock enable signal and the plurality of commands, and to allow the refresh control unit to enter the self-refresh mode or exit from the self-refresh mode; and
a buffer control unit configured to disable the plurality of command buffers and the plurality of address buffers when the clock enable signal is deactivated, and to enable the plurality of command buffers and the plurality of address buffers when the refresh control unit exits from the self-refresh mode,
wherein the buffer control unit is configured to enable the plurality of command buffers and the plurality of address buffers when the refresh control unit exits from the self-refresh mode regardless of the period in which the word line is activated in a case in which the refresh control unit performs the word line activation operation in the self-refresh mode.

15. The semiconductor memory device of claim 14, wherein the buffer control unit is configured to disable the plurality of command buffers and the plurality of address buffers in a period in which the word line is activated when the refresh control unit performs the word line activation operation in an auto-refresh mode.

16. The semiconductor memory device of claim 14, wherein the buffer control unit is configured to disable the plurality of command buffers and the plurality of address buffers after a given time passes when the clock enable signal is deactivated.

* * * * *